United States Patent
Xu et al.

(10) Patent No.: US 11,711,894 B1
(45) Date of Patent: Jul. 25, 2023

(54) CAPACITIVELY COUPLED RESONATORS FOR HIGH FREQUENCY GALVANIC ISOLATORS

(71) Applicant: Analog Devices International Unlimited Company, Limerick (IE)

(72) Inventors: Jinglin Xu, Reading, MA (US); Paul Lambkin, Carrigaline (IE); Ramji Lakshmanan, Limerick (IE); Baoxing Chen, Westford, MA (US)

(73) Assignee: Analog Devices International Unlimited Company, Limerick (IE)

( * ) Notice: Subject to any disclaimer, the term of this patent is extended or adjusted under 35 U.S.C. 154(b) by 0 days.

(21) Appl. No.: 17/592,452

(22) Filed: Feb. 3, 2022

(51) Int. Cl.
  *H01L 23/64*  (2006.01)
  *H05K 1/18*   (2006.01)
  *H01L 23/66*  (2006.01)
  *H05K 1/11*   (2006.01)
  *H04L 25/02*  (2006.01)

(52) U.S. Cl.
  CPC .......... *H05K 1/185* (2013.01); *H01L 23/642* (2013.01); *H01L 23/66* (2013.01); *H04L 25/0266* (2013.01); *H05K 1/119* (2013.01)

(58) Field of Classification Search
  CPC ............. H04L 25/0266; H01L 23/5223; H01L 23/5222; H01L 23/642; H01L 23/49589
  See application file for complete search history.

(56) References Cited

U.S. PATENT DOCUMENTS

| | | | |
|---|---|---|---|
| 8,013,688 B2 | 9/2011 | White et al. | |
| 8,080,865 B2 | 12/2011 | Harvey | |
| 8,169,108 B2 | 5/2012 | Dupuis et al. | |
| 8,660,489 B2 | 2/2014 | Barrenscheen et al. | |
| 8,674,486 B2 | 3/2014 | Chang et al. | |

(Continued)

FOREIGN PATENT DOCUMENTS

| | | |
|---|---|---|
| CN | 2318700 Y | 5/1999 |
| CN | 102958432 A | 3/2013 |

(Continued)

OTHER PUBLICATIONS

Arif et al., Loss Optimization of Coplanar strips for CMOS RFICs. Birck and NCN Publications. Paper 550. 2009; 5 pages.

(Continued)

*Primary Examiner* — Jeremy C Norris
(74) *Attorney, Agent, or Firm* — Wolf, Greenfield & Sacks, P.C.

(57) ABSTRACT

Isolators for high frequency signals transmitted between two circuits configured to operate at different voltage domains are provided. The isolators may include resonators capable of operating at high frequencies with high bandwidth, high transfer efficiency, high isolation rating, and a small substrate footprint. In some embodiments, the isolators may operate at a frequency not less than 30 GHz, not less than 60 GHz, or between 20 GHz and 200 GHz, including any value or range of values within such range. The isolators may include isolator components galvanically isolated from and capacitively coupled to each other. The sizes and shapes of the isolator components may be configured to control the values of equivalent inductances and capacitances of the isolators to facilitate resonance in operation. The isolators are compatible to different fabrication processes including, for example, micro-fabrication and PCB manufacture processes.

20 Claims, 11 Drawing Sheets

(56) References Cited

U.S. PATENT DOCUMENTS

| | | |
|---|---|---|
| 9,007,141 B2 | 4/2015 | Steeneken |
| 9,093,973 B2 | 7/2015 | Nagai |
| 9,224,534 B2 | 12/2015 | Nagai et al. |
| 9,287,910 B2 | 3/2016 | Fujiwara et al. |
| 9,380,705 B2 | 6/2016 | Chen |
| 9,391,353 B2 | 7/2016 | Nagai |
| 9,520,354 B1 | 12/2016 | Chow et al. |
| 9,640,604 B2 | 5/2017 | Chen |
| 9,852,941 B2 | 12/2017 | Chen |
| 9,941,565 B2 | 4/2018 | McLoughlin et al. |
| 9,960,671 B2 | 5/2018 | Ho et al. |
| 10,164,614 B2 | 12/2018 | Yang et al. |
| 10,211,281 B2 | 2/2019 | Chow et al. |
| 10,236,247 B2 | 3/2019 | Ho et al. |
| 10,446,498 B2 | 10/2019 | Constantino et al. |
| 10,505,258 B2 | 12/2019 | Lee et al. |
| 10,541,195 B2 | 1/2020 | Wang et al. |
| 11,044,022 B2 | 6/2021 | O'Sullivan et al. |
| 11,152,975 B2 | 10/2021 | Lambkin et al. |
| 2010/0020448 A1 | 1/2010 | Ng et al. |
| 2012/0189246 A1 | 7/2012 | Hofrichter et al. |
| 2014/0262464 A1 | 9/2014 | Chen |
| 2015/0234417 A1 | 8/2015 | Kawai et al. |
| 2015/0280785 A1 | 10/2015 | Brauchler et al. |
| 2016/0308402 A1 | 10/2016 | Alavikia et al. |
| 2018/0108621 A1 | 4/2018 | Burton et al. |
| 2018/0130867 A1 | 5/2018 | Lambkin et al. |
| 2018/0148318 A1 | 5/2018 | Flynn et al. |
| 2018/0240761 A1 | 8/2018 | Burton et al. |
| 2019/0019776 A1 | 1/2019 | Tuncer et al. |
| 2020/0076512 A1 | 3/2020 | O'Sullivan et al. |
| 2021/0065955 A1 | 3/2021 | Lambkin et al. |
| 2021/0119670 A1 | 4/2021 | Lambkin et al. |

FOREIGN PATENT DOCUMENTS

| | | |
|---|---|---|
| CN | 103617992 A | 3/2014 |
| CN | 104170164 A | 11/2014 |
| CN | 103943956 B | 6/2016 |
| CN | 107591597 A | 1/2018 |
| JP | 2008-067012 A | 3/2008 |
| JP | 2016-052124 A | 4/2016 |
| KR | 101451705 | 10/2014 |
| WO | 2014/171091 | 10/2014 |
| WO | 2014/171125 | 10/2014 |
| WO | 2018/021973 A2 | 2/2018 |

OTHER PUBLICATIONS

Aydin et al., Split Ring Resonator-Coupled Enhanced Transmission through a Single Subwavelength Aperture. Jan. 7, 2009; 14 pages. Retrieved from Internet: https://arxiv.org/ftp/arxiv/papers/0805/0805.3907.pdf Last accessed Dec. 16, 2019.

Bonache et al., Complementary Split Ring Resonators for Microstrip Diplexer Design. Electronics Letters. Jul. 7, 2005; 41(14): 2 pages.

Frank et al., Coupled loops at 20 GHz for stacked planar circuits. Electronics Letters. Apr. 26, 2007;43(9):513-514.

Gingerich et al., The ISO72x Family of High-Speed Digital Isolators. Texas Instruments. SLLA198A-January 2006-Revised Aug. 2018. Application Report, HPL—Interface. 13 pages.

Heebl et al., Comprehensive Analysis and Measurement of Frequency-Tuned and Impedance-Tuned Wireless Non-Radiative Power Transfer Systems. Jan. 14, 2014; Retrieved from the Internet: https://arxiv.org/pdf/1401.3324.pdf. Last accessed Dec. 16, 2019; 11 pages.

Kurs et al., Wireless Power Transfer via Strongly Coupled Magnetic Resonances. Science. Jul. 6, 2007; 317:83-86.

Li et al., Compact Microstrip Bandpass Diplexer Based on Twist Revised Split Ring Resonators. International Journal of Antennas and Propagation. Mar. 30, 2015; 2015: Article ID 69874, 6 pages.

Lu et al., A Review on the Recent Development of Capacitive Wireless Power Transfer Technology. Energies, Nov. 1, 2017. 10(11):1752. 30 pages. https://doi.org/10.3390/en10111752.

Lu et al., A Double-Sided LC-Compensation Circuit for Loosely Coupled Capacitive Power Transfer. IEEE Transaction on Power Electronics, Feb. 2018. vol. 33, No. 2. pp.1633-1643. 11 pages.

Nadeem et al., Study on Mutual Coupling Reduction Technique for MIMO Antennas. IEEEAccess. Jan. 2018:25 pages.

Ponchak et al., Measured attenuation of coplanar waveguide on CMOS grade silicon substrates with polyimide interface layer. Electronics Letters. Jun. 25, 1998; 34(13): 1327-1329.

Schurig et al., Metamaterial Electromagnetic Cloak at Microwave Frequencies. Sciencexpress. Oct. 19, 2006; 10.1126:8 pages.

Selvaraju et al., Complementary Split Ring Resonator for Isolation Enhancement in 5G Communication Antenna Array. Progress in Electromagnetics Research C. Jan. 2018;83:217-228.

CAPACITIVELY COUPLED RESONATORS FOR HIGH FREQUENCY GALVANIC ISOLATORS

FIELD OF THE DISCLOSURE

The present application relates to galvanic isolators providing galvanic isolation between circuits.

BACKGROUND

Isolators provide electrical isolation between circuits which communicate with each other. In some situations, circuits which communicate with each other operate at different voltages, for instance one at a relatively high voltage and the other at a relatively low voltage. In some situations, the circuits are referenced to different electrical ground potentials. Isolators can be used to electrically isolate circuits in either of these situations. Connecting multiple isolators in series may increase the amount of isolation between the circuits.

BRIEF SUMMARY

Isolators for high frequency signals transmitted between two circuits configured to operate at different voltage domains are provided. The isolators may include resonators capable of operating at high frequencies with high bandwidth, high transfer efficiency, high isolation rating, and a small substrate footprint. In some embodiments, the isolators may operate at a frequency not less than 30 GHz, not less than 60 GHz, or between 20 GHz and 200 GHz, including any value or range of values within such range. The isolators may include isolator components galvanically isolated from and capacitively coupled to each other. The sizes and shapes of the isolator components may be configured to control the values of equivalent inductances and capacitances of the isolators to facilitate resonance in operation. The isolators are compatible to different fabrication processes including, for example, micro-fabrication and PCB manufacture processes.

Some embodiments relate to an integrated isolator device. The integrated isolator device may include a substrate; an insulative layer on the substrate; a first pair of conductive plates comprising a first conductive plate and a second conductive plate separated from each other by the insulative layer; and a second pair of conductive plates comprising a third conductive plate and a fourth conductive plate separated from each other by the insulative layer. The first conductive plate and the third conductive plate may be in a first metallization layer and separated from each other by a first gap sized between 10 μm and 80 μm such that the integrated isolator device can operate at a frequency between 20 GHz and 200 GHz.

In some embodiments, the second conductive plate and the fourth conductive plate may be in a second metallization layer separated from the first metallization layer by the insulative layer. The second conductive plate and the fourth conductive plate may be separated from each other by a first gap sized between 10 μm and 80 μm.

In some embodiments, the integrated isolator device may include a first pair of traces comprising a first trace extending from the first conductive plate and a second trace extending from the third conductive plate, and a second pair of traces comprising a third trace extending from the second conductive plate and a fourth trace extending from the fourth conductive plate. The first pair of traces and the second pair of traces are shaped and sized to provide capacitances and inductances such that a first isolator component comprising the first conductive plate, the third conductive plate and the first pair of traces operate in resonance with a second isolator component comprising the second conductive plate, the fourth conductive plate and the second pair of traces.

In some embodiments, the first pair of traces and the second pair of traces may be in rotational symmetry.

In some embodiments, the first conductive plate may have a length sized between 200 μm and 800 μm, and a width sized such that a ratio of the length to the width of the conductive plate is between 1.5 and 3.5.

In some embodiments, the first trace and the second trace of the first pair of traces may be separated from each other by a second gap sized to be smaller than the first gap between the first conductive plate and the third conductive plate.

In some embodiments, the first pair of conductive plates and the second pair of conductive plates may be sized such that the integrated isolator device has a characteristic impedance of a value between 50 Ohm and 150 Ohm.

In some embodiments, the insulative layer may include a first insulative layer of a first material and a second insulative layer of a second material different from the first material and stacked on top of the first insulative layer.

In some embodiments, the insulative layer may have a thickness of a value between 20 μm and 150 μm.

In some embodiments, the first conductive plate may have a width and a length that are configured to have a product of a value between 0.005 mm$^2$ and 0.05 mm$^2$.

Some embodiments relate to an integrated isolator device. The integrated isolator device may include a substrate; an insulative layer on the substrate; a first pair of conductive plates comprising a first conductive plate and a second conductive plate separated from each other by the insulative layer; a second pair of conductive plates comprising a third conductive plate and a fourth conductive plate separated from each other by the insulative layer; a third pair of conductive plates comprising a fifth conductive plate and a sixth conductive plate separated from each other by the insulative layer; a fourth pair of conductive plates comprising a seventh conductive plate and an eighth conductive plate separated from each other by the insulative layer; a first trace extending between and electrically coupling the first conductive plate and the fifth conductive plate; and a second trace extending between and electrically coupling the third conductive plate and the seventh conductive plate. The first conductive plate and the third conductive plate may be in a first metallization layer and separated from each other by a first gap having a first value. The first trace and the second trace may be separated from each other by a second gap having a second value. The second value may be smaller than the first value. The second conductive plate and the fourth conductive plate may be configured to receive an input signal. The sixth conductive plate and the eighth conductive plate may be configured to provide an output signal.

In some embodiments, the fifth conductive plate and the seventh conductive plate may be in the first metallization layer. The second conductive plate, the fourth conductive plate, the sixth conductive plate and the eighth conductive plate may be in a second metallization layer separated from the first metallization layer by the insulative layer.

In some embodiments, the integrated isolator device may include a first pair of traces comprising a third trace extending from the second conductive plate and a fourth trace extending from the fourth conductive plate. The third trace and the fourth trace are separated by a third gap having the second value.

In some embodiments, the integrated isolator device may include a second pair of traces comprising a fifth trace extending from the sixth conductive plate and a sixth trace extending from the eighth conductive plate. The first pair of traces and the second pair of traces may be in rotational symmetry.

In some embodiments, the first trace and the second trace may be in symmetry.

In some embodiments, the first conductive plate may have a length sized between 200 μm and 800 μm.

Some embodiments relate to a system. The system may include an integrated isolator device that may include an insulative layer, a first pair of conductive plates comprising a first conductive plate and a second conductive plate separated from each other by the insulative layer, and a second pair of conductive plates comprising a third conductive plate and a fourth conductive plate separated from each other by the insulative layer. The system may include a transmitter coupled to a first isolator component comprising the first conductive plate and the third conductive plate, and configured to operate in a first voltage domain; and a receiver coupled to a second isolator component comprising the second conductive plate and the fourth conductive plate, and configured to operate in a second voltage domain different from the first voltage domain. The first conductive plate and the third conductive plate are in a first metallization layer and separated from each other by a first gap sized between 10 μm and 80 μm.

In some embodiments, a voltage different between the first voltage domain and the second voltage domain is of a value between 100 V and 2 kV.

In some embodiments, the system may include a substrate. The integrated isolator device, transmitter, and receiver may be on the substrate and coupled through one or more redistribution layers.

In some embodiments, the system may include a printed circuit board comprising the first metallization layer and a second metallization layer. The second pair of conductive plates of the integrated isolator device may be in the second metallization layer of the printed circuit board.

These techniques may be used alone or in any suitable combination. The foregoing summary is provided by way of illustration and is not intended to be limiting.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Figure 1:
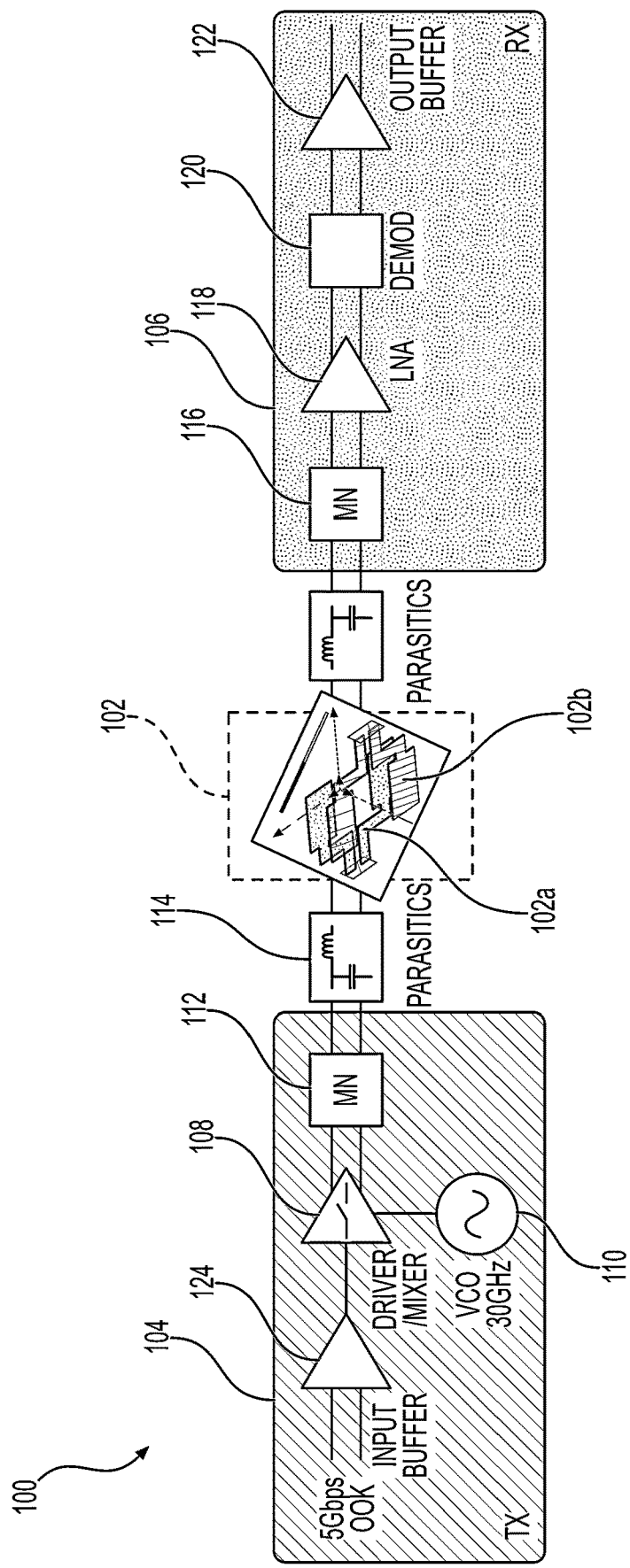
FIG. 1 is a simplified schematic of a system including an integrated isolator device, according to some embodiments.

Described herein are isolators capable of operating at high frequencies with high bandwidth, high transfer efficiency, high isolation rating, and a small substrate footprint. In some embodiments, the isolators may operate at a frequency not less than 20 GHz, not less than 60 GHz, or between 20 GHz and 200 GHz, including any value or range of values within such range. In some embodiments, the isolators may have a bandwidth not less than 5 GHz, between 5 GHz and 100 GHz, or between 5 GHz and 180 GHz, including any value or range of values within such range. In some embodiments, the isolators may have transfer efficiency between 10% and 90%, including any value or range of values within such range. In some embodiments, the isolators may have isolation rating between 100 V and 2 kV, including any value or range of values within such range. In some embodiments, the isolators may have substrate footprint between (100 um)$^2$ and (1 cm)$^2$, including any value or range of values within such range. The inventors have recognized and appreciated that conventional isolators cannot operate at such high frequencies with such high bandwidths and provide sufficient isolation and high transfer efficiency at the same time. For instance, isolators having closely spaced and magnetically coupled inductors exhibit either high transfer efficiency (if the inductors are closely spaced) but poor isolation rating, or vice versa if the inductors are spaced by a relatively large distance.

Aspects of the present application provide isolator apparatus and methods for high frequency operation with high bandwidth, high transfer efficiency, high isolation rating, and a small substrate footprint. Isolators according to some embodiments include isolator components tuned to operate at a same resonant frequency as each other such that the isolator components may be separated by a larger distance, providing for high isolation rating while maintaining high transfer efficiency at high frequencies. In some embodiments, the isolator components may be tuned to have a desirable characteristic impedance such that the isolator can operate at high frequency with high bandwidth. The inventors have recognized and appreciated that higher impedance values may result in bandwidth loss due to parasitic capacitances, and lower impedance values may cause additional power consumption from the driving circuits. In some embodiments, the desired characteristic impedance may be between 50Ω and 150Ω, including any value or range of values within such range.

In some embodiments, the isolator components of an isolator may include conductive plates galvanically isolated from and capacitively coupled to each other. In some embodiments, the conductive plates may be configured to provide desired equivalent capacitances and inductances of the isolator components to facilitate resonance in operation. In some embodiments, traces may introduce to the isolator components capacitances and inductances additional to the capacitances and inductances of the conductive plates such that the isolator components operate at the desired resonance frequency. In some embodiments, the conductive plates may be configured such that the equivalent capacitances and inductances of the isolator components, taking into account the capacitances and inductances of the traces, have desired values for providing not only a desired resonance frequency of the isolator components but also a desired characteristic impedance for the isolator to operate at high frequency with high bandwidth.

In some embodiments, a system may include circuits operating at different voltage domains. In some embodiments, the voltage difference between the different voltage domains may be higher than 400 V, higher than 600 V, or higher than 2 kV. The system may include an isolator to provide galvanic isolation between the circuits operating at the different voltage domains. The isolator may also be configured to withstand electrical surge events, for example, in the range of 10 kV to 20 kV.

FIG. 1 depicts such a system 100 including an integrated isolator device 102, according to some embodiments. The integrated isolator device 102 may provide galvanic isolation between a transmitter 104 and a receiver 106, which may operate at different voltage domains corresponding to, for example, different supply voltages and/or different reference voltages.

The transmitter 104 may receive signals in various formats including, for example, digital data with on-off keying (OOK) modulation. The transmitter 104 may include an input buffer 124 to timely provide the received signals to a driver/mixer 108. The driver/mixer 108 may be configured to tune the frequency of the received signals based, at least in part, on a clock signal (e.g., 30 GHz) from a voltage-controlled oscillator (VCO) 110. The transmitter 104 may include a matching network (MN) 112 configured to match the output impedance of the transmitter 104 with the input impedance of the integrated isolator device 102. The matching network 112 may be configured to account for parasitics 114 caused by, for example, input pads and interconnections between the transmitter 104 and the integrated isolator device 102. The matching network 112 may be configured to provide a reasonable quality factor (Q) of a first isolator component 102a coupled to the transmitter 104 to yield a flat passband, which may reduce jitter.

The integrated isolator device 102 may include the first isolator component 102a coupled to the transmitter 104 and a second isolator component 102b coupled to the receiver 106. The first and second isolator components 102a and 102b may be galvanically isolated from and inductively coupled to each other. The first and second isolator components 102a and 102b may be positioned to overlap, at least partially, with each other such that the isolator components are capacitively coupled to each other. The first and second isolator components 102a and 102b may be configured to have a resonance frequency that may enable the isolator to operate at high frequencies with high transfer efficiency, and a characteristic impedance that may enable the isolator to operate at the high frequencies with high bandwidth.

The receiver 106 may receive signals through the second isolator component 102b. The receiver 106 may include a matching network (MN) 116 configured to match the output impedance of the integrated isolator device 102 with the input impedance of a low noise amplifier (LNA) 118. The matching network 116 may also be configured to account for parasitics. The matching network 116 may be configured to provide a reasonable Q factor of the second isolator component 102b coupled to the receiver 106. The LNA 118 may be AC coupled to a demodulator 120. The receiver 106 may output data through an output buffer 122.

Figure 2:
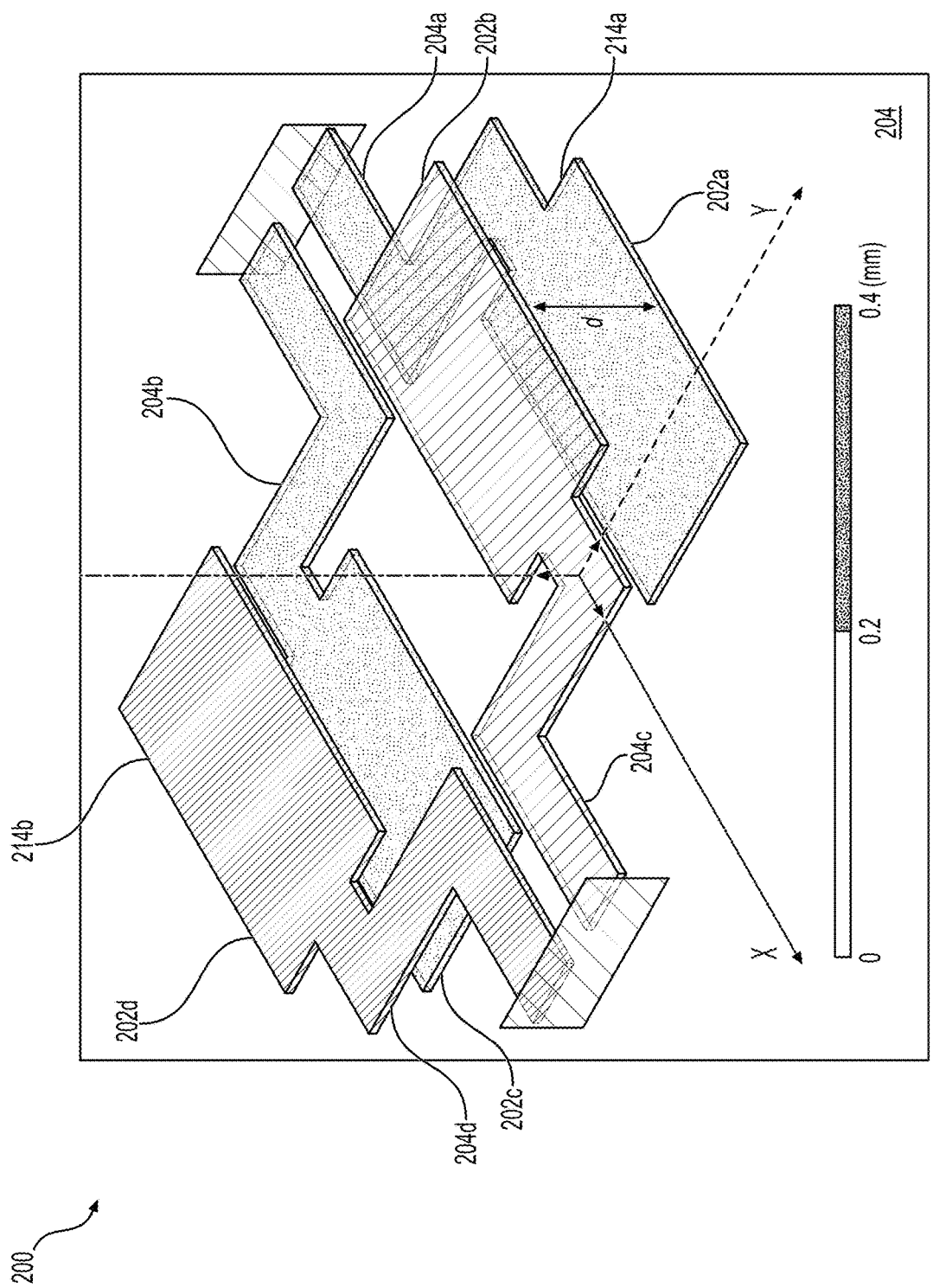
FIG. 2 is a schematic perspective view of an integrated isolator device, according to some embodiments.

In some embodiments, an integrated isolator device may include isolator components stacked vertically. FIG. 2 depicts an integrated isolator device 200 with a first isolator component 214a and a second isolator component 214b, stacked vertically on a substrate 204, according to some embodiments. The first isolator component 214a may be coupled to a first circuit (e.g., transmitter 104) operating at a first voltage domain. The second isolator component 214b may be coupled to a second circuit (e.g., receiver 106) operating at a second voltage domain. The first isolator component 214a and the second isolator component 214b may be galvanically isolated from each other by a distance d. The distance d may be selected such that the transfer efficiency between the first and second isolator components is sufficiently efficient, for example, no more than 3 dB loss across an operating bandwidth of the integrated isolator device 200. The distance d may also be selected such that the integrated isolator device 200 can withstand high voltage differences and surge events.

The first isolator component 214a may include a first conductive plate 202a, a third conductive plate 202c, and a pair of traces including a first trace 204a and a second trace 204b. The second isolator component 214b may include a second conductive plate 202b, a fourth conductive plate 202d, and a pair of traces including a third trace 204c and a fourth trace 204d. The first conductive plate 202a of the first isolator component 214a and the second conductive plate 202b of the second isolator component 214b may be capacitively coupled to each other by, for example, being aligned vertically with each other. The third conductive plate 202c of the first isolator component 214a and the fourth conductive plate 202d of the second isolator component 214b may be capacitively coupled to each other by, for example, being aligned vertically with each other. The first trace 204a, second trace 204b, third trace 204c, and fourth trace 204d may extend from the first conductive plate 202a, third conductive plate 202c, second conductive plate 202b, and fourth conductive plate 202d, respectively. The first trace 204a and second trace 204b of the first isolator component 214a may not overlap with the second isolator component 214b. The third trace 204c and fourth trace 204d of the second isolator component 214b may not overlap with the first isolator component 214a.

Figure 3A:
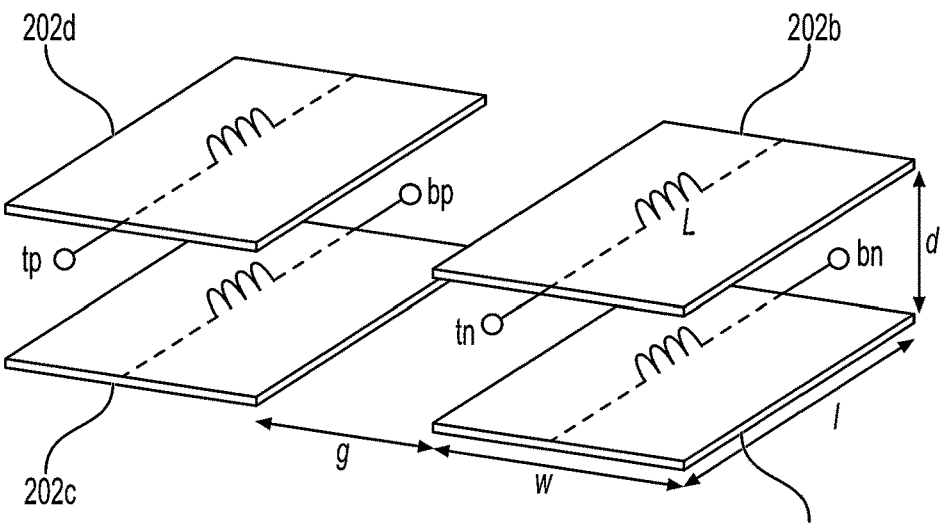
FIG. 3A is a schematic view of conductive plates of the integrated isolator device of FIG. 2, according to some embodiments.

The inventors have recognized and appreciated that the conductive plates may be configured such that the equivalent capacitances and inductances of the isolator components have desired values for providing not only a desired resonance frequency of the isolator components but also a desired characteristic impedance for the isolator to operate at high frequency with high bandwidth. FIG. 3A illustrates the conductive plates 202a-202d of the integrated isolator device 200. As illustrated, each conductive plate may have a length l and a width w. The first conductive plate 202a and third conductive plate 202c of the first isolator component 214a may be separated by a gap of a value g. Similarly, the second conductive plate 202b and fourth conductive plate 202d of the second isolator component 214b may be separated by a gap of the value g. Each conductive plate may result in an internal inductance L, which may be proportional to $$\frac{\mu}{4\pi} 2l \left( \ln \frac{2l}{0.23w} - 1 + \frac{0.23w}{l} \right),$$

where µ may represent the permeability of the material surrounding the conductive plates. Although the conductive plates are rectangle-shaped in the illustrated example, a person of ordinary skill in the art would appreciate that the conductive plates may have any suitable shapes such as circular shapes or irregular shapes, and corresponding lengths and widths may be identified in the shapes.

Figure 3B:
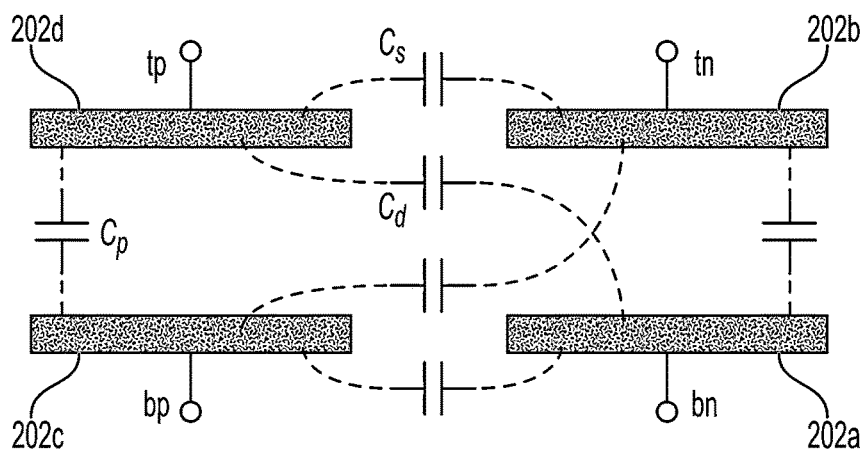
FIG. 3B is a schematic view of a capacitor model of the conductive plates of FIG. 3A, according to some embodiments.

FIG. 3B illustrates a capacitor model of the conductive plates 202a-202d. As illustrated, the capacitive coupling between the first conductive plate 202a and second conductive plate 202b may result in a parallel plate capacitance Cp, which may be proportional $$\varepsilon \frac{lw}{d},$$

where ε may represent the permittivity of the material galvanically isolating the conductive plates. Similarly, the capacitive coupling between the third conductive plate 202c and fourth conductive plate 202d may result in a parallel plate capacitance Cp. The capacitive coupling between the first conductive plate 202a and fourth conductive plate 202d may result in a diagonal coupled capacitance Cd, which may be proportional to $$\varepsilon \frac{lw}{2(g+w+d)},$$

where ε may represent the permittivity of the material galvanically isolating the conductive plates. Similarly, the capacitive coupling between the third conductive plate 202c and second conductive plate 202b may result in a diagonal coupled capacitance Cd. The capacitive coupling between the first conductive plate 202a and third conductive plate 202c may result in a side coupled capacitance Cs, which may be proportional to $$\varepsilon \frac{lw}{g+w},$$

where ε may represent the permittivity of the material galvanically isolating the conductive plates. Similarly, a capacitive coupling between the second conductive plate 202b and fourth conductive plate 202d may result in a side coupled capacitance Cs.

Figure 3C:
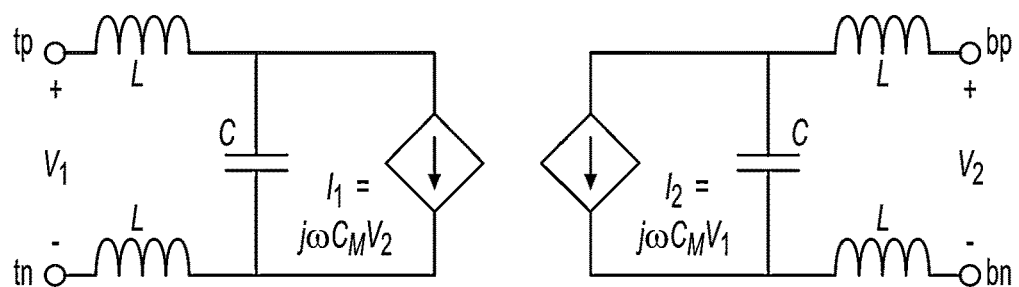
FIG. 3C is a schematic view of an equivalent circuit of the conductive plates of FIG. 3A, according to some embodiments.

FIG. 3C illustrates an equivalent circuit of the conductive plates 202a-202d, which simplifies the capacitor model of FIG. 3B into a two-port model. In the two-port model, C may represent an internal self-capacitance of an isolator component, which may be computed as follows:

$$C = C_s + \frac{C_p + C_d}{2}$$

$C_M$ may represent an equivalent mutual capacitance between isolator components, which may be computed as follows:

$$C_M = \frac{C_p - C_d}{2}$$

Accordingly, a characteristic impedance Ze of the circuit may be computed using the following relationship:

$$Z_e^2 = \frac{4L}{C} \frac{1 - \sqrt{1 - (C_M/C)^2}}{1 - (C_M/C)^2}$$

The inventors have recognized and appreciated that a desired characteristic impedance $Z_e$ may be configured to be in the range of 50Ω to 150Ω such that the isolator can operate at high frequency.

The conductive plates may operate in series operating modes between a first frequency $\omega_1$, which may be proportional to $$\frac{1}{\sqrt{L(C+C_M)}},$$

and a second frequency $\omega_2$, which may be proportional to $$\frac{1}{\sqrt{L(C-C_M)}}.$$

Accordingly, a center frequency may be proportional to $$\frac{1}{\sqrt{2LC}};$$

the bandwidth may be proportional to $$\frac{C_M}{C} \omega_0.$$

Figure 4:
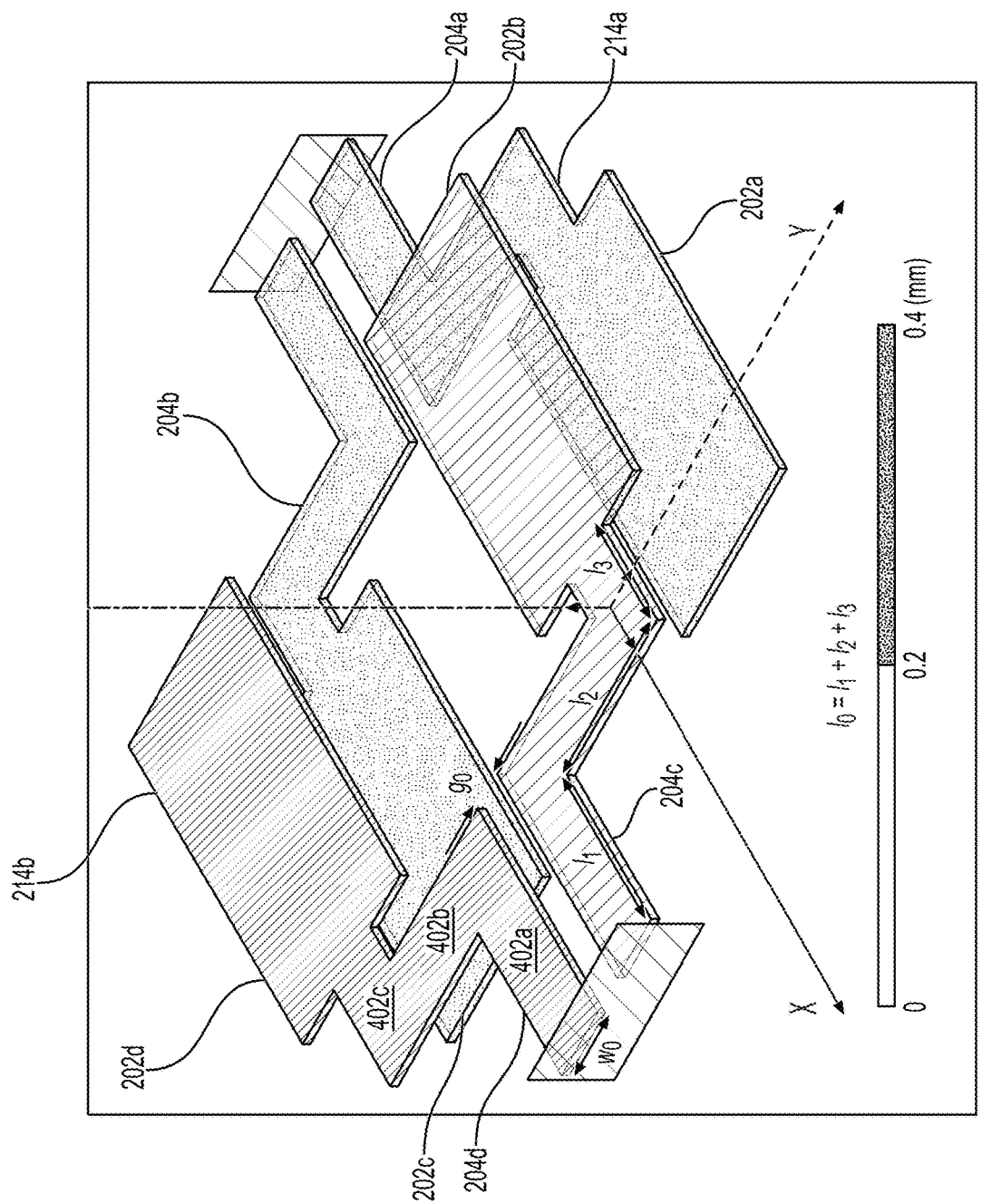
FIG. 4 is a schematic view of the integrated isolator device of FIG. 2, with dimensions of traces marked, according to some embodiments.

The inventors have recognized and appreciated that the traces extending from the conductive plates may be configured together with the conductive plates such that the equivalent capacitances and inductances of the isolator components have desired values for providing not only a desired resonance frequency of the isolator components but also a desired characteristic impedance for the isolator to operate at high frequency with high bandwidth. FIG. 4 is a schematic view of the integrated isolator device 200, with dimensions of the traces 204a-204d marked, according to some embodiments.

A trace may have a width w0 and extend by a length $l_0$. The trace may have one or more portions. As illustrated, a trace may have three portions 402a, 402b, and 402c, extending by lengths $l_1$, $l_2$, and $l_3$, respectively. Accordingly, the length $l_0$ of the trace may be the sum of the lengths $l_1$, $l_2$, and $l_3$ of the portions 402a, 402b, and 402c. In the illustrated example, the first portion 402a may be substantially parallel to the third portion 402c and substantially perpendicular to the second portion 402b. It should be appreciated that the present disclosure should not be limited in this aspect and the portions of a trace may be in any suitable relationship such as forming angles. Although the trace has three portions in the illustrated example, it should be appreciated that a trace may include any suitable number of portions including, for example, two or four. In some embodiments, a trace may include one or more curved portions.

The traces of a pair in a same isolator component may be separated by a gap of a value $g_0$. As illustrated, the two traces of a pair in an isolator component may be in symmetry. The first pair of traces of the first isolator component 214a and the second pair of traces of the second isolator component 214b may be in rotational symmetry. It should be appreciated that the traces in a same isolator and/or in different isolator components may be shaped similarly or differently. Each trace may result in an internal inductance $L_0$, which may be proportional to $$\frac{\mu}{4\pi} 2l_0 \left( \ln \frac{2l_0}{0.23w_0} - 1 + \frac{0.23w_0}{l_0} \right),$$

where µ may represent the permeability of the material surrounding the trace.

Accordingly, an internal inductance L' of an isolator component may be the sum of the internal inductance $L_0$ of the trace and the internal inductance L of a corresponding conductive plate. The pair of traces in a same isolator component may result in an internal self-capacitance $C_0$, which may be proportional to $$\varepsilon \frac{l_0 w_0}{g_0 + w_0},$$

where ε may represent the permittivity of the material separating the two traces of the pair.

Figure 5A:
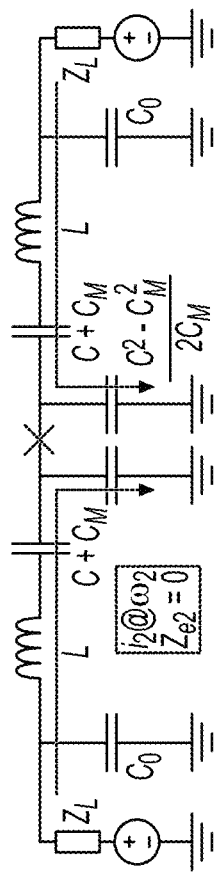
FIG. 5A is a circuit schematic view of the effective configuration of the integrated isolator device of FIG. 2 in a first operating mode, according to some embodiments.
Figure 5B:
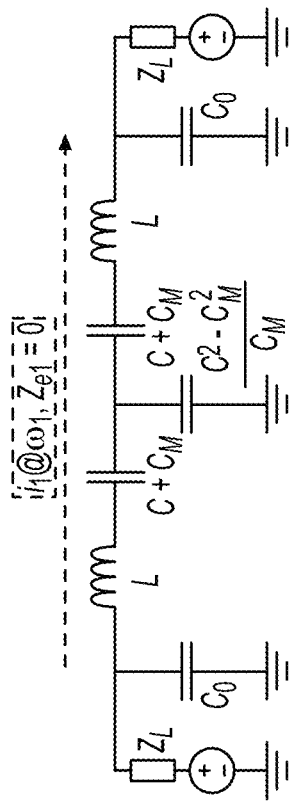
FIG. 5B is a circuit schematic view of the effective configuration of the integrated isolator device of FIG. 2 in a second operating mode, according to some embodiments.

The internal self-capacitances $C_0$ of the traces may be configured to enable the isolator device to have a wide bandwidth. FIGS. 5A-5B are circuit schematic views of the effective configuration of the integrated isolator device 200 in series operating modes between a first frequency $\omega_1$, which may be proportional to $$\frac{1}{\sqrt{L'(C + C_M)}},$$

and a second frequency $\omega_2$, which may be proportional to $$\frac{1}{\sqrt{L'(C - C_M)}}.$$

Figure 5C:
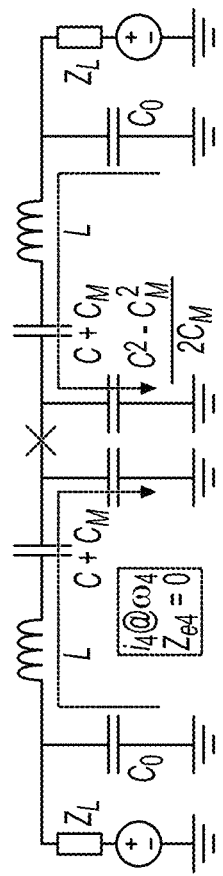
FIG. 5C is a schematic view of the effective configuration of the integrated isolator device of FIG. 2 in a third operating mode, according to some embodiments.
Figure 5D:
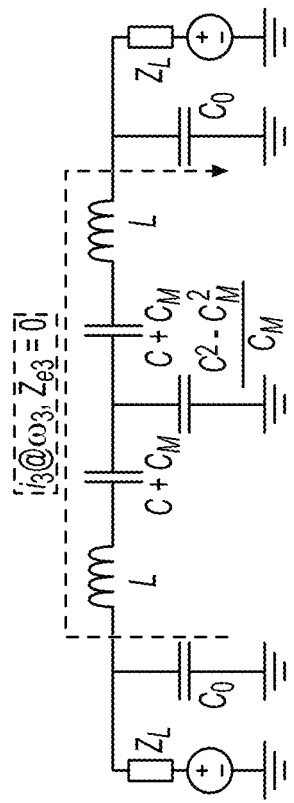
FIG. 5D is a schematic view of the effective configuration of the integrated isolator device of FIG. 2 in a fourth operating mode, according to some embodiments.

The isolator device operating in the series operating modes may have a bandwidth BW1, which may equal to $\omega_2 - \omega_1$. FIGS. 5C-5D are circuit schematic views of the effective configuration of the integrated isolator device 200 in parallel operating modes between a third frequency $\omega_3$, which may be proportional to $$\frac{1}{\sqrt{L'(C + C_M) \| C_0}},$$

and a fourth frequency $\omega_4$, which may be proportional to $$\frac{1}{\sqrt{L'(C - C_M) \| C_0}}.$$

Figure 6:
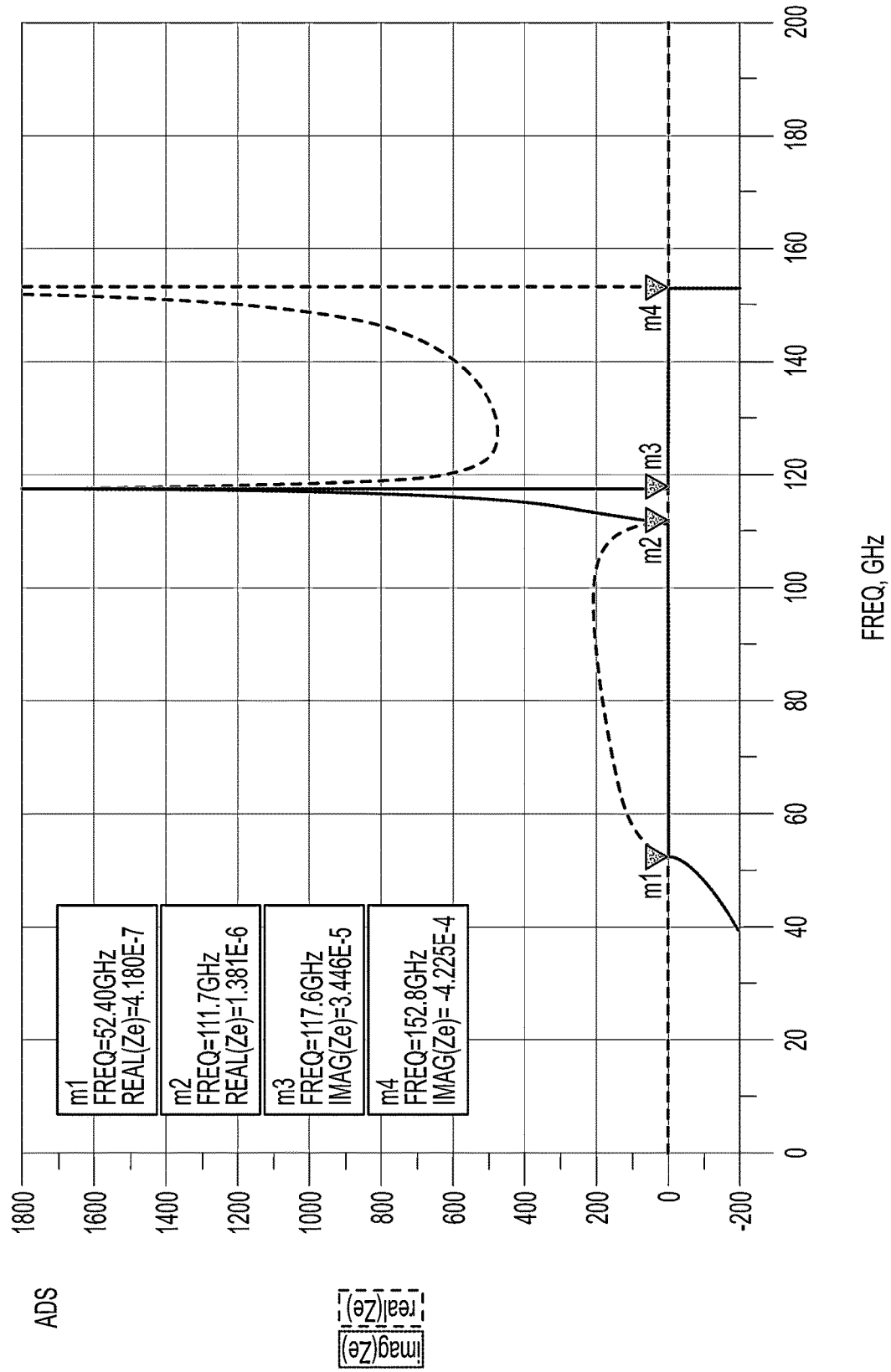
FIG. 6 is a schematic view of simulated impedance-to-frequency results of the integrated isolator device of FIG. 2, according to some embodiments.

The isolator device operating in the parallel operating modes may have a bandwidth BW2, which may equal to $\omega_4 - \omega_3$. FIG. 6 illustrates simulated impedance-to-frequency results of the integrated isolator device 200, according to some embodiments.

The inventors have recognized and appreciated that the isolator components may be configured to have a wide bandwidth BW, which may be the sum of BW1 and BW2. In some embodiments, the value $g_0$ of the gap between the two traces in an isolator component may be configured to be smaller than the value g of the gap between the two conductive plates in the isolator component, such that the internal self-capacitances $C_0$ of the traces may manifest.

Accordingly, the isolator components may be configured for the isolator device to operate at high frequencies with high bandwidth, high transfer efficiency, high isolation rating, and a small substrate footprint. In some embodiments, the length l and width w of a conductive plate may be in the scale of a hundred micrometers. In some embodiments, the length l of a conductive plate may be between 200 µm and 800 µm, including any value or range of values within such range. In some embodiments, a ratio of the length l to the width w of a conductive plate may be between 1.5 and 3.5, including any value or range of values within such range. In some embodiments, the length l and width w of a conductive plate may be configured to have a product of a value between 0.005 mm² and 0.05 mm². In some embodiments, the value g of the gap between two conductive plates in an isolator component may be between 10 µm and 80 µm, including any value or range of values within such range. In some embodiments, the distance d between two isolator components may be in the range of 20 µm to 500 µm, in the range of 20 µm to 300 µm, or in the range of 20 µm to 150 µm, including any value or range of values within such ranges.

Figure 7A:
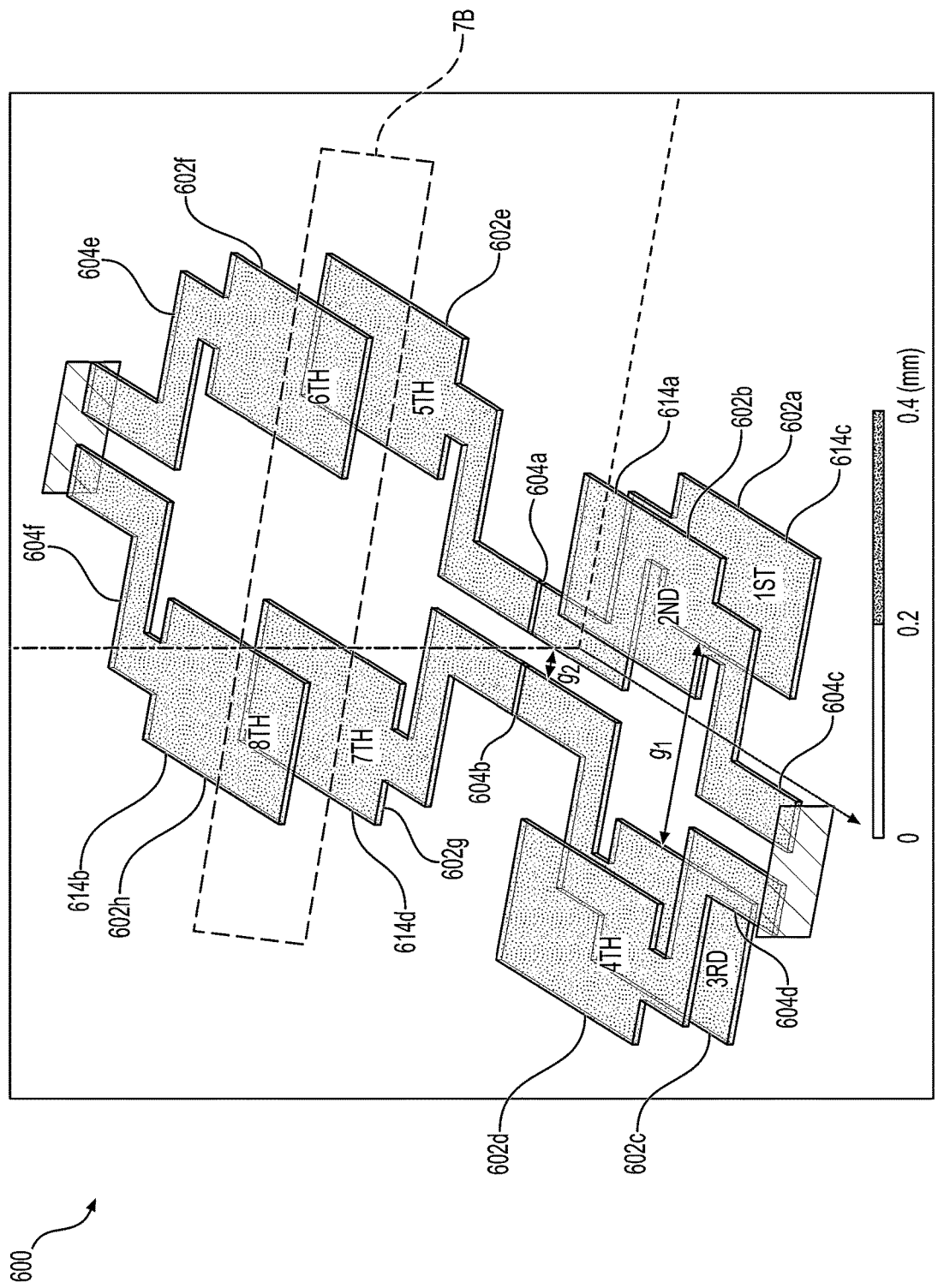
FIG. 7A is a schematic perspective view of an integrated isolator device having a back-to-back configuration, according to some embodiments.
Figure 7B:
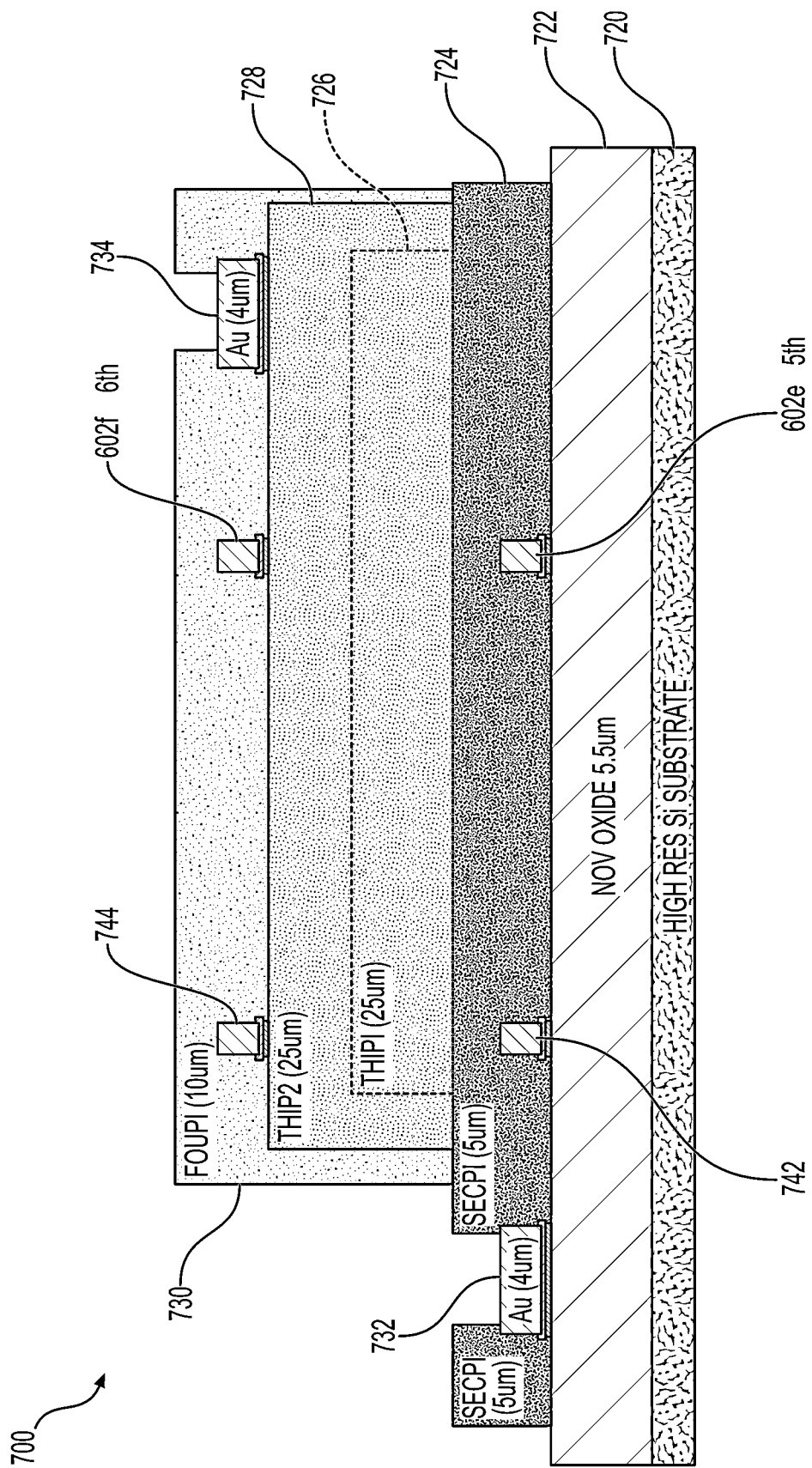
FIG. 7B is a cross-sectional view of the integrated isolator device of FIG. 7A across a plane marked 7B, according to some embodiments.

In some embodiments, an integrated isolator device may have a back-to-back configuration. In some embodiments, an integrated isolator device with a back-to-back configuration may include a first isolator component coupled to a first circuit operating at a first voltage domain and a second isolator component coupled to a second circuit operating at a second voltage domain. The first isolator component and the second isolator component may be galvanically isolated from each other. The first isolator component and the second isolator component may be capacitively coupled to each other through multiple isolator components, for example, at least two isolator components so as to achieve a higher isolation rating with the cumulative isolation properties of the at least two isolator components. The isolator components of an integrated isolator device may be configured to have a same resonant frequency such that energy relays through the multiple isolator components can maintain a high transfer efficiency, for example, less than 3 dB loss across a large operating bandwidth. FIGS. 7A-7B depict integrated isolator devices with a back-to-back configuration, according to some embodiments.

FIG. 7A depicts an integrated isolator device 600, which may include a first isolator component 614*a* coupled to a first circuit (e.g., transmitter 104) operating at a first voltage domain. The integrated isolator device 600 may include a second isolator component 614*b* coupled to a second circuit (e.g., receiver 106) operating at a second voltage domain. The first isolator component 614*a* and the second isolator component 614*b* may be galvanically isolated from and capacitively coupled to each other.

The first isolator component 614*a* and second isolator component 614*b* may be capacitively coupled to each other through a third isolator component 614*c* and fourth isolator component 614*d*. The first isolator component 614*a* and second isolator component 614*b* may be disposed in a first plane on a substrate. The third isolator component 614*c* and fourth isolator component 614*d* may be disposed in a second plane on the substrate. The third isolator component 614*c* and fourth isolator component 614*d* may be electrically isolated from the first isolator component 614*a* and second isolator component 614*b*.

The first isolator component 614*a* may include a second conductive plate 602*b*, a fourth conductive plate 602*d*, and a pair of traces including a third trace 604*c* and a fourth trace 604*d*. The second isolator component 614*b* may include a sixth conductive plate 602*f*, an eighth conductive plate 602*h*, and a pair of traces including a fifth trace 604*e* and a sixth trace 604*f*. The third trace 604*c*, fourth trace 604*d*, fifth trace 604*e*, and sixth trace 604*f* may extend from the second conductive plate 602*b*, fourth conductive plate 602*d*, sixth conductive plate 602*f*, and eighth conductive plate 602*h*, respectively.

The third isolator component 614*c* may include a first conductive plate 602*a* and a third conductive plate 602*c*. The fourth isolator component 614*d* may include a fifth conductive plate 602*e* and a seventh conductive plate 602*g*. A first trace 604*a* may extend between and electrically couple the first conductive plate 602*a* and the fifth conductive plate 602*e*. A second trace 604*b* may extend between and electrically couple the third conductive plate 602*c* and the seventh conductive plate 602*g*.

The second conductive plate 602*b* of the first isolator component 614*a* and the first conductive plate 602*a* of the third isolator component 614*c* may be capacitively coupled to each other by, for example, being aligned vertically with each other. The fourth conductive plate 602*d* of the first isolator component 614*a* and the third conductive plate 602*c* of the third isolator component 614*c* may be capacitively coupled to each other by, for example, being aligned vertically with each other. The third trace 604*c* and fourth trace 604*d* of the first isolator component 614*a* may not overlap with the third isolator component 614*c*.

The sixth conductive plate 602*f* of the second isolator component 614*b* and the fifth conductive plate 602*e* of the fourth isolator component 614*d* may be capacitively coupled to each other by, for example, being aligned vertically with each other. The eighth conductive plate 602*h* of the second isolator component 614*b* and the seventh conductive plate 602*g* of the fourth isolator component 614*d* may be capacitively coupled to each other by, for example, being aligned vertically with each other. The fifth trace 604*e* and sixth trace 604*f* of the second isolator component 614*b* may not overlap with the fourth isolator component 614*d*. The first trace 604*a* and second trace 604*b* may not overlap with the first isolator component 614*a* and second isolator component 614*b*.

Similar to the isolator device 200, the isolator components of the isolator device 600 may be configured for the isolator device 600 to operate at high frequencies with high bandwidth, high transfer efficiency, high isolation rating, and a small substrate footprint. In some embodiments, two conductive plates in an isolator component may be separated by a gap of a value $g_1$. In some embodiments, the value $g_1$ of the gap between the two conductive plates in the isolator component may be between 10 μm and 80 μm, including any value or range of values within such range. In some embodiments, the first trace 604*a* and second trace 604*b* may be separated by a gap of a value $g_2$, which may be configured to be smaller than the value $g_1$ of the gap between the two conductive plates in the isolator component.

Although the first isolator component 614*a* and the second isolator component 614*b* are capacitively coupled to each other through two isolator components in the illustrated example in FIG. 7A, it should be appreciated that the first isolator component 614*a* and the second isolator component 614*b* may be capacitively coupled to each other through more than two isolator components so as to, for example, achieve a higher isolation rating with the cumulative isolation properties of the increased number of isolator components. Although the first plane is above the second plane in the illustrated example, it should be appreciated that the first plane may be below the second plane in some embodiments. Although the integrated isolator device 600 includes isolator components fabricated on a single substrate as illustrated, it should be appreciated that the integrated isolator device 600 may include isolator components fabricated on different substrates and coupled together through, for example, bonding technologies. For example, the first and third isolator components 614*a* and 614*c* may be fabricated on one substrate, and the second and fourth isolator components 614*b* and 614*d* may be fabricated on another substrate. The third and fourth isolator components 614*c* and 614*d* may be electrically shorted together through bonding wires.

FIG. 7B depicts a cross-sectional view of the integrated isolator device 700 across a plane marked 7B in FIG. 7A, according to some embodiments. The integrated isolator device 700 may be fabricated on a substrate 720 and isolated from the substrate 720 by an insulating layer 722. The insulating layer 722 may have a suitable thickness, such as between 3 μm and 10 μm (e.g., 5.5 μm). The fifth conductive plate 602*e* may be in a first metallization layer 742 and covered by an insulating layer 724. The insulating layer 724 may have a suitable thickness, such as between 3 μm and 10 μm (e.g., 5 μm). One or more pads 732 may be in the first metallization layer 742 and configured to provide access to the fourth isolator component. The first metallization layer 742 may be formed of a suitable material, such as gold, and may have a suitable thickness, such as between 2 μm and 9 μm (e.g., 4 μm). The sixth conductive element 602*f* may be in a second metallization layer 744 and covered by an insulating layer 730. One or more pads 734 may be in the second metallization layer 744 and configured to provide access to the second isolator component. The second metallization layer 744 may be formed of a suitable material, which may be similar to or different from the first metallization layer 742. The second metallization layer 744 may have a suitable thickness, which may be similar to or different from the first metallization layer 742. The second and fourth isolator components 714*b* and 714*d* may be isolated from each other by one or more inductive layers. In the illustrated example, the fifth conductive plate 602*e* and sixth conductive plate 602*f* may be isolated from each other by two insulating layers 726 and 728. The insulating layers 726 and 728 may have a suitable combined thickness, such as between 20 µm and 500 µm (e.g., 50 µm). The insulating layers 726 and 728 may have similar or different thicknesses. Although examples of materials with thicknesses are illustrated in FIG. 7B, it should be appreciated that the examples are not limiting.

Figure 8:
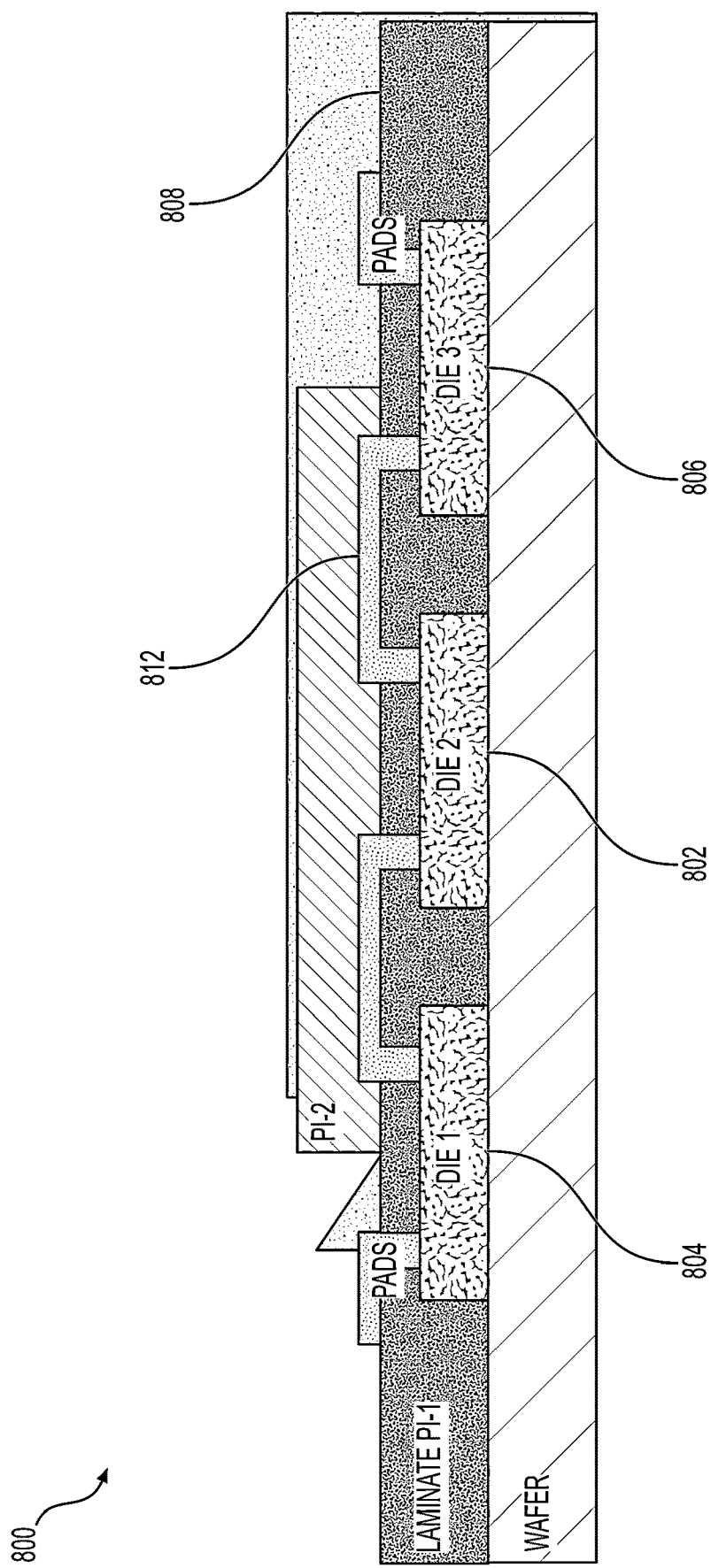
FIG. 8 is a cross-sectional view of a system including an integrated isolator device, according to some embodiments.
Figure 9A:
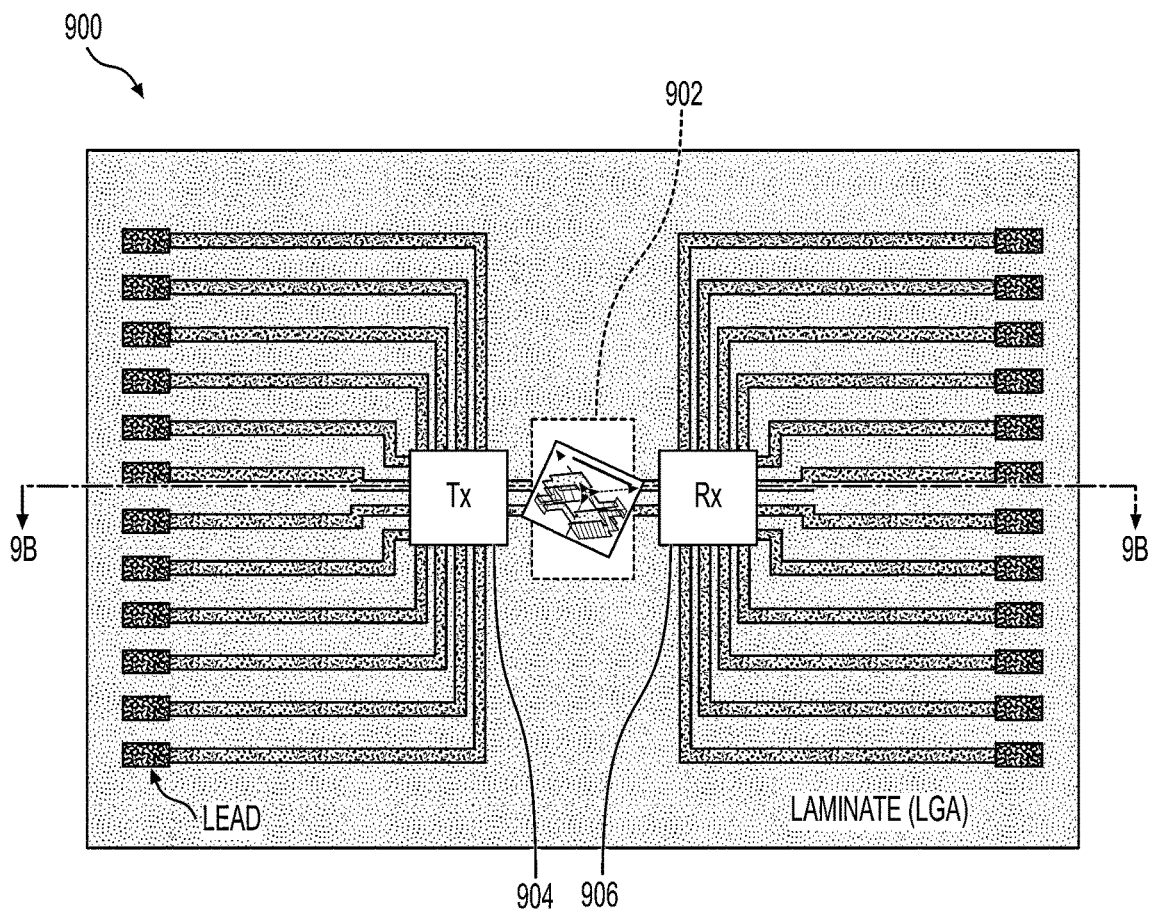
FIG. 9A is a top view of a system including an integrated isolator device, according to some embodiments.
Figure 9B:
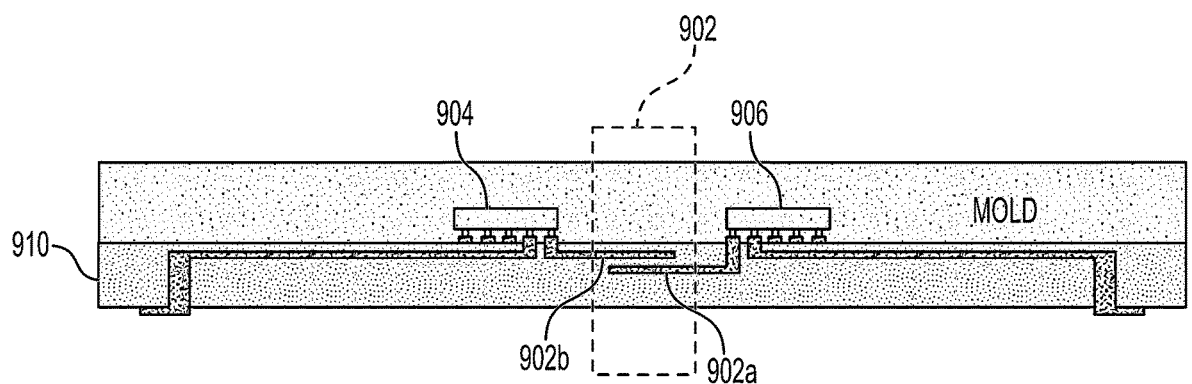
FIG. 9B is a cross-sectional view of the system of FIG. 9A along a line marked 9B, according to some embodiments.

The integrated isolator devices described herein may be compatible to various fabrication processes including, for example, micro-fabrication and printed circuit board (PCB) manufacture processes. It should be appreciated that an inductive loop described herein enables the use of various fabrication processes because inductive loops described herein are simpler than conventional isolators (e.g., spiral inductors) and thus can be fabricated with technologies such as PCB processes that have coarse design rules. FIG. 8 depicts an isolator system 800 fabricated using a redistribution layer (RDL) process, according to some embodiments. FIGS. 9A-9B depict an isolator system 900 fabricated using a device in a packaging process, according to some embodiments.

FIG. 8 depicts a cross-sectional view of the isolator system 800 in accordance with some embodiments. The isolator system 800 may include dies 802, 804 and 806 attached to a substrate 814 (e.g., a wafer). The first die 802 may include an integrated isolator device as described herein. The second die 804 may include a first circuit operating at a first voltage domain (e.g., transmitter 104). The third die 806 may include a second circuit operating at a second voltage domain (e.g., receiver 106). The dies may be isolated from each other by an insulating layer 808, and coupled to each other through a redistribution layer 812. The insulating layer 808 may be formed of a suitable material such as laminate. The redistribution layer 812 may be formed of a suitable material, such as gold. At least a portion of the redistribution layer 812 may be covered by an insulating layer 816 such as polyimide. One or more pads 818 may be in the redistribution layer 812.

FIG. 9A depicts a top view of the isolator system 900 in accordance with some embodiments. FIG. 9B depicts a cross-sectional view of the system 900 along a line marked 9B in FIG. 9A in accordance with some embodiments. The isolator system 900 may include an integrated isolator device 902 in accordance with any embodiments described herein. The integrated isolator device 902 may be formed in a printed circuit board 910. The integrated isolator device 902 may include a first isolator component 902*a* formed in a first metallization layer of the PCB, and a second isolator component 902*b* formed in a second metallization layer of the PCB and galvanically isolated from the first isolator component 902*a*. The isolator system 900 may include dies 904 and 906. The first die 904 may include a first circuit operating at a first voltage domain (e.g., transmitter 104). The second die 906 may include a second circuit operating at a second voltage domain (e.g., receiver 106). The first and second dies 904 and 906 may be coupled to the integrated isolator device 902 through, for example, solder balls and/or one or more of PCB metallization layers. The first and second dies 904 and 906 may be covered by a molding layer 908 formed of a suitable material such as polyimide.

Figure 10:
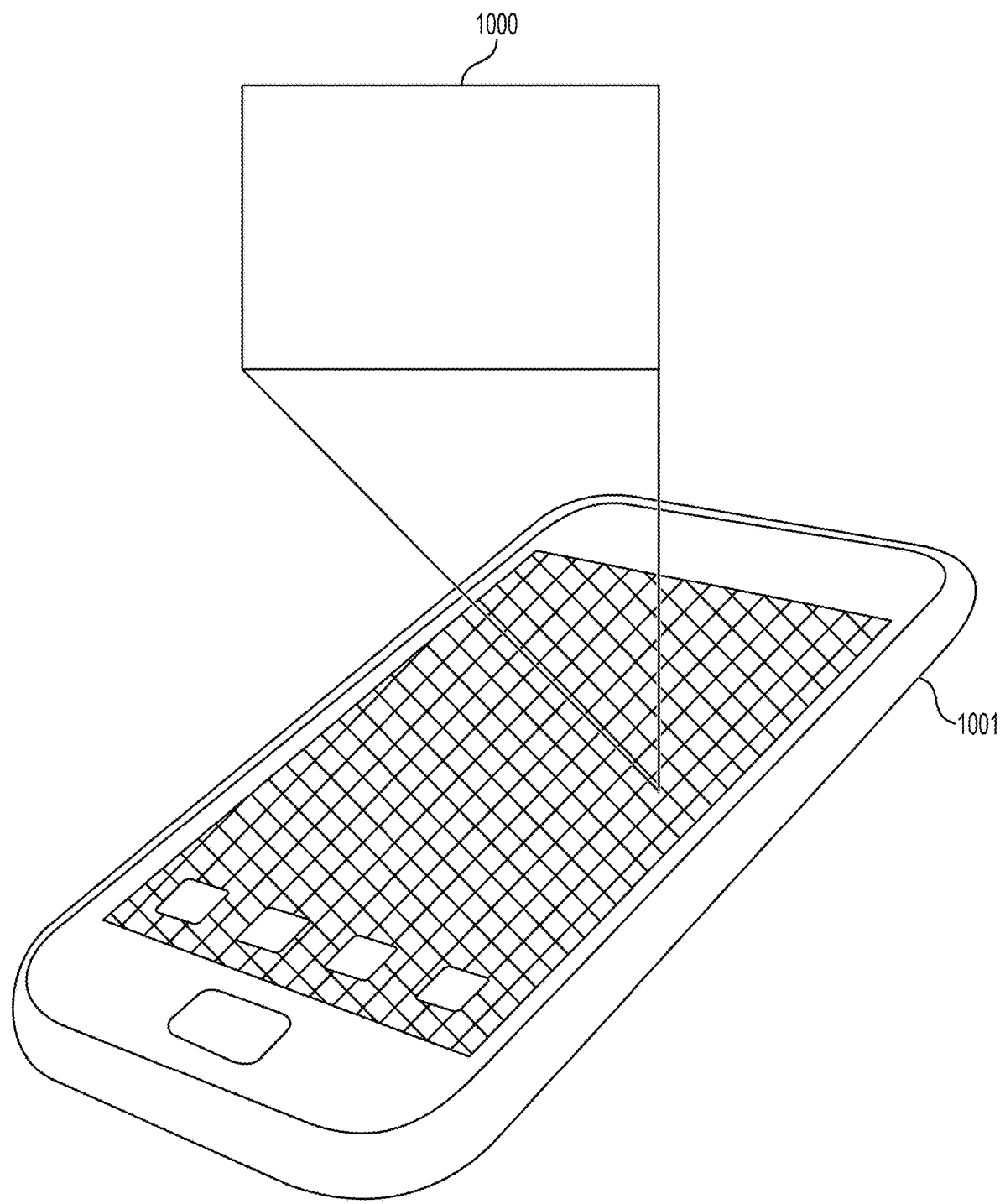
FIG. 10 is a schematic diagram illustrating a portable electronic device incorporating an integrated isolator device, according to some embodiments.

Integrated isolator devices of the types described herein may be used in various devices and settings. For example, the integrated isolator devices may be used for isolation in medical equipment systems, industrial equipment systems, physical measurement systems, or personal or portable electronic equipment. FIG. 10 is a schematic diagram showing a non-limiting application of an integrated isolator system in a portable electronic device setting, according to some embodiments. An integrated isolator system 1000 may be used in a portable electronic device 1001 to transmit power across an isolation barrier with both high transfer efficiency and high isolation rating at high operating frequencies. The portable electronic device 1001 may be a smartphone, personal digital assistant (PDA), tablet or other portable device. Other such devices may make use of integrated isolator systems of the types described herein.

While FIG. 10 illustrates an example of a portable electronic device 1001 incorporating aspects of the present application, other uses are possible. For example, one or more integrated isolator systems 1000 may be employed in an automobile or a medical instrument. Various embodiments of the present application may be implemented to provide high transfer efficiency and high isolation rating at high operating frequencies.

Various embodiments have been described as providing isolators with insulating materials, which may be with different permittivity values. The specific permittivity values of the materials are not limiting, as various materials with relatively higher and lower permittivity values may be used. However, non-limiting examples are now provided. Non-limiting examples of the higher permittivity dielectric materials that may be used around arcs of the inductive loops, such as insulating layers 724 and 730, include silicon nitride (SiN), aluminum oxide ($Al_2O_3$), tantalum pentoxide ($Ta_2O_5$), strontium titanate ($SrTiO_3$), bismuth ferrite ($BiFeO_3$), silicon dioxide ($SiO_2$), and barium strontium titinate (BST).

A non-limiting example of the lower permittivity dielectric materials that may be used in embodiments of the dielectric regions described herein, such as lower permittivity dielectric regions 726 and 728, includes polyimide.

Examples of conductive materials that may be used to form isolator components (e.g., inductive loops, capacitors, traces) in embodiments of the integrated isolator device described herein include gold and copper, or any other suitable conductive material.

Examples of substrate materials that may be used in embodiments of the integrated isolator device described herein, such as substrates 204 and 720, include silicon, quartz, and laminate. In some embodiments, the substrate of the integrated isolator device may be an insulating substrate.

The integrated isolator devices described herein may be used in various applications (e.g., industrial, medical, consumer). For example, data transfer and/or power transfer between galvanically isolated systems may be accomplished with the integrated isolator devices described herein. As one example, medical equipment in a room in which a medical procedure is being performed may be galvanically isolated from a control system in a control room. For instance, a piece of medical imaging equipment and/or monitors in the room in which the procedure is being performed may be isolated from a system controlling operation of the imaging equipment and/or display. The isolator may be an integrated isolator device and/or system of any of the types described herein, and the isolated signal path may be analog or digital.

As another example, industrial equipment may be isolated from a control system controlling the equipment. For example, high wattage motors may be isolated from control systems controlling their operation by integrated isolator device of the types described herein. The control systems may operate at a lower wattage than the high wattage motors used by the industrial equipment. The isolator may be disposed on a circuit board on which various circuit components connected to the motors and/or control equipment are included.

Other uses of the integrated isolator devices described herein are also possible, as those examples described are non-limiting.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value.

What is claimed is:

1. An integrated isolator device comprising:
   a substrate;
   an insulative layer on the substrate;
   a first pair of conductive plates comprising a first conductive plate and a second conductive plate separated from each other by the insulative layer; and
   a second pair of conductive plates comprising a third conductive plate and a fourth conductive plate separated from each other by the insulative layer,
   wherein the first conductive plate and the third conductive plate are in a first metallization layer and separated from each other by a first gap sized between 10 μm and 80 μm such that the integrated isolator device can operate at a frequency between 20 GHz and 200 GHz.

2. The integrated isolator device of claim 1, wherein:
   the second conductive plate and the fourth conductive plate are in a second metallization layer separated from the first metallization layer by the insulative layer, and
   the second conductive plate and the fourth conductive plate are separated from each other by a first gap sized between 10 μm and 80 μm.

3. The integrated isolator device of claim 1, comprising:
   a first pair of traces comprising a first trace extending from the first conductive plate and a second trace extending from the third conductive plate, and
   a second pair of traces comprising a third trace extending from the second conductive plate and a fourth trace extending from the fourth conductive plate,
   wherein the first pair of traces and the second pair of traces are shaped and sized to provide capacitances and inductances such that a first isolator component comprising the first conductive plate, the third conductive plate and the first pair of traces operate in resonance with a second isolator component comprising the second conductive plate, the fourth conductive plate and the second pair of traces.

4. The integrated isolator device of claim 3, wherein the first pair of traces and the second pair of traces are in rotational symmetry.

5. The integrated isolator device of claim 3, wherein the first conductive plate has a length sized between 200 μm and 800 μm, and a width sized such that a ratio of the length to the width of the conductive plate is between 1.5 and 3.5.

6. The integrated isolator device of claim 5, wherein: the first trace and the second trace of the first pair of traces are separated from each other by a second gap sized to be smaller than the first gap between the first conductive plate and the third conductive plate.

7. The integrated isolator device of claim 1, wherein the first pair of conductive plates and the second pair of conductive plates are sized such that the integrated isolator device has a characteristic impedance of a value between 50 Ohm and 150 Ohm.

8. The integrated isolator device of claim 1, wherein the insulative layer comprises a first insulative layer of a first material and a second insulative layer of a second material different from the first material and stacked on top of the first insulative layer.

9. The integrated isolator device of claim 1, wherein the insulative layer has a thickness of a value between 20 μm and 150 μm.

10. The integrated isolator device of claim 1, wherein the first conductive plate has a width and a length that are configured to have a product of a value between 0.005 mm$^2$ and 0.05 mm$^2$.

11. An integrated isolator device comprising:
    a substrate;
    an insulative layer on the substrate;
    a first pair of conductive plates comprising a first conductive plate and a second conductive plate separated from each other by the insulative layer;
    a second pair of conductive plates comprising a third conductive plate and a fourth conductive plate separated from each other by the insulative layer;
    a third pair of conductive plates comprising a fifth conductive plate and a sixth conductive plate separated from each other by the insulative layer;
    a fourth pair of conductive plates comprising a seventh conductive plate and an eighth conductive plate separated from each other by the insulative layer;
    a first trace extending between and electrically coupling the first conductive plate and the fifth conductive plate; and
    a second trace extending between and electrically coupling the third conductive plate and the seventh conductive plate, wherein:
    the first conductive plate and the third conductive plate are in a first metallization layer and separated from each other by a first gap having a first value,
    the first trace and the second trace are separated from each other by a second gap having a second value,
    the second value is smaller than the first value,
    the second conductive plate and the fourth conductive plate are configured to receive an input signal, and
    the sixth conductive plate and the eighth conductive plate are configured to provide an output signal.

12. The integrated isolator device of claim 11, wherein:
    the fifth conductive plate and the seventh conductive plate are in the first metallization layer, and
    the second conductive plate, the fourth conductive plate, the sixth conductive plate and the eighth conductive plate are in a second metallization layer separated from the first metallization layer by the insulative layer.

13. The integrated isolator device of claim 11, comprising:
    a first pair of traces comprising a third trace extending from the second conductive plate and a fourth trace extending from the fourth conductive plate, wherein the third trace and the fourth trace are separated by a third gap having the second value.

14. The integrated isolator device of claim 13, comprising:
  a second pair of traces comprising a fifth trace extending from the sixth conductive plate and a sixth trace extending from the eighth conductive plate,
  wherein the first pair of traces and the second pair of traces are in rotational symmetry.

15. The integrated isolator device of claim 11, wherein the first trace and the second trace are in symmetry.

16. The integrated isolator device of claim 11, wherein the first conductive plate has a length sized between 200 μm and 800 μm.

17. A system comprising:
  an integrated isolator device comprising:
    an insulative layer,
    a first pair of conductive plates comprising a first conductive plate and a second conductive plate separated from each other by the insulative layer, and
    a second pair of conductive plates comprising a third conductive plate and a fourth conductive plate separated from each other by the insulative layer;
  a transmitter coupled to a first isolator component comprising the first conductive plate and the third conductive plate, and configured to operate in a first voltage domain; and
  a receiver coupled to a second isolator component comprising the second conductive plate and the fourth conductive plate, and configured to operate in a second voltage domain different from the first voltage domain,
  wherein the first conductive plate and the third conductive plate are in a first metallization layer and separated from each other by a first gap sized between 10 μm and 80 μm.

18. The system of claim 17, wherein a voltage difference between the first voltage domain and the second voltage domain is of a value between 100 V and 2 kV.

19. The system of claim 17, comprising:
  a substrate, wherein the integrated isolator device, transmitter, and receiver are on the substrate and coupled through one or more redistribution layers.

20. The system of claim 17, comprising:
  a printed circuit board comprising the first metallization layer and a second metallization layer,
  wherein the second pair of conductive plates of the integrated isolator device is in the second metallization layer of the printed circuit board.

* * * * *